United States Patent
Joly et al.

(10) Patent No.: US 10,630,274 B2
(45) Date of Patent: Apr. 21, 2020

(54) METHOD FOR BIASING OUTPUTS OF A FOLDED CASCODE STAGE IN A COMPARATOR AND CORRESPONDING COMPARATOR

(71) Applicant: STMicroelectronics (Rousset) SAS, Rousset (FR)

(72) Inventors: Yohan Joly, Meyreuil (FR); Vincent Binet, Aix en Provence (FR)

(73) Assignee: STMICROELECTRONICS (ROUSSET) SAS, Rousset (FR)

(*) Notice: Subject to any disclaimer, the term of this patent is extended or adjusted under 35 U.S.C. 154(b) by 0 days.

(21) Appl. No.: 16/449,700

(22) Filed: Jun. 24, 2019

(65) Prior Publication Data
US 2020/0014376 A1    Jan. 9, 2020

(30) Foreign Application Priority Data

Jul. 5, 2018   (FR) .................................... 18 56189

(51) Int. Cl.
*H03K 5/24*     (2006.01)
*H03F 3/45*     (2006.01)
*H03K 3/3565*   (2006.01)

(52) U.S. Cl.
CPC ....... *H03K 5/2481* (2013.01); *H03F 3/45134* (2013.01); *H03F 3/45192* (2013.01); *H03F 3/45506* (2013.01); *H03K 3/3565* (2013.01); *H03F 2200/78* (2013.01); *H03F 2203/45* (2013.01)

(58) Field of Classification Search
None
See application file for complete search history.

(56) References Cited

U.S. PATENT DOCUMENTS

| | | | |
|---|---|---|---|
| 5,313,114 A * | 5/1994 | Poletto | H03K 3/02337 327/205 |
| 6,940,329 B2 * | 9/2005 | Tsai | H03K 5/2481 327/205 |
| 6,970,022 B1 | 11/2005 | Miller | |
| 8,614,602 B2 * | 12/2013 | Sharma | H03F 3/193 330/253 |
| 2012/0015617 A1 | 1/2012 | Srivastava et al. | |
| 2013/0082778 A1 | 4/2013 | Sharma | |

FOREIGN PATENT DOCUMENTS

EP          0594305 A1    9/1993

* cited by examiner

Primary Examiner — Jeffery S Zweizig
(74) Attorney, Agent, or Firm — Slater Matsil, LLP

(57) ABSTRACT

A comparator includes a folded cascode stage having positive and negative outputs. The folded cascode stage includes: a common-mode voltage regulation circuit that includes resistive elements that are respectively situated between each of the outputs and a common-mode node. A compensation circuit is configured to regulate a difference between the voltages on the outputs, and is configured to generate a constant and continuous compensation current in the two resistive elements. A hysteresis circuit is configured to offset voltages on the outputs, and to generate a hysteresis current in the two resistive elements.

20 Claims, 7 Drawing Sheets

METHOD FOR BIASING OUTPUTS OF A FOLDED CASCODE STAGE IN A COMPARATOR AND CORRESPONDING COMPARATOR

CROSS-REFERENCE TO RELATED APPLICATIONS

This application claims priority to French Patent Application No. 1856189, filed on Jul. 5, 2018, which application is hereby incorporated herein by reference.

TECHNICAL FIELD

The present invention relates generally to an electronic system and method, and, in particular embodiments, to a method for biasing outputs of a folded cascode stage in a comparator and corresponding comparator.

BACKGROUND

In a comparator circuit, two input voltages are compared and an output voltage representative of the difference between the input voltages is generated. The comparison is typically performed by way of a differential pair of transistors.

FIG. 1 shows an example of differential pairs of transistors, which pairs are configured to be incorporated into a comparator but have shortcomings in terms of efficiency.

The transistors of the differential pairs preferably have very close features, in particular the voltage threshold, in order to ensure accurate comparison. Due to manufacturing uncertainties with the transistors, it is difficult to manufacture paired transistors having strictly the same features for a reasonable cost. Typically, to pair the transistors of a differential pair, resistive compensators 20, including resistive elements 21, 23 that are connected to the sources of the transistors of the differential pair, make it possible to apply a corrective potential to the respective sources. The corrective potential pre-biases the gate-source voltages of the transistors of the pair so that they exhibit similar behavior in response to the input voltages IN−, IN+ on their gates. This improves the input accuracy of the comparator.

Moreover, hysteresis between the input voltages IN−, IN+ is generally introduced following triggering of a comparison. The hysteresis effect ensures that stray comparisons due to unforeseen variations, for example due to electrical noise, are avoided. The hysteresis effect is typically achieved by modifying the conductivity of one transistor of the differential pair, biasing the input value necessary to trigger the transistors. For example, to modify the conductivity of a transistor, one conventional solution involves connecting or disconnecting, upon request, a stack of transistors 11, 12, 13, 14, 15, 16, 17 in parallel to or from one of the transistors of a differential pair.

This type of hysteresis structure 10 requires a non-negligible surface area in order to be implemented, and the transistors in parallel 11-17 introduce a stray capacitance at input IN−, IN+, which increases the propagation delay of the signal in the comparator. For example, the stray capacitance, such as the gate capacitances of the transistors in parallel 11-17, may have a value of more than five times the input capacitance without a hysteresis structure 10.

Furthermore, the resistive elements 21, 23 belonging to the resistive compensators 20 typically introduce a stray polysilicon/substrate capacitance to the sources of the transistors of the differential pairs.

In comparators that are intended to be highly efficient, in particular in terms of input-output propagation speed, these stray capacitances are extremely detrimental and difficult to reduce in the art.

There is thus a need to design high-speed comparators whose input capacitance is minimized, while at the same time retaining the input accuracy and the generation of a hysteresis effect.

SUMMARY

One or more embodiments relate to a high-speed comparator.

According to one aspect, embodiments relate to a method for biasing a positive output and a negative output of a folded cascode stage of a comparator. The method comprises regulating the voltages on the positive output and on the negative output including a flow of a regulation current in two resistive elements that are situated respectively between the two outputs and a common-mode node having a constant common-mode voltage. A constant and continuous compensation current are generated in the two resistive elements, so as to compensate a difference between effective threshold values of at least one differential pair of transistors of the comparator, which pair is coupled upstream of the folded cascode stage. A hysteresis current is generated in the two resistive elements in a manner controlled by a hysteresis control signal, so as to introduce a hysteresis offset to input values of the comparator that is necessary to trigger an output signal representative of a comparison of the input values.

According to aspects, it is proposed to implement improvements to the input accuracy of the comparator and to hysteresis generation on a folded cascode stage of the comparator, without introducing stray capacitance that slows down operation. The input-output speed of the comparator is thus increased, whereas the input accuracy and the hysteresis generation are harnessed perfectly.

According to one mode of implementation, the compensation current is injected onto one of the positive or negative outputs by way of one respective cascode transistor and extracted from the other of the outputs by way of another respective cascode transistor.

The cascode transistors are advantageously controlled so as to increase the output impedance of the positive and negative outputs.

With the compensation current thus being able to flow in the resistive elements in one direction or in the other, it is possible to compensate a positive difference or a negative difference between the effective threshold values of a differential pair of transistors.

Moreover, passing through cascode transistors makes it possible in particular not to add stray capacitances at nodes of the comparator that support rapid signal variations, and thus not to increase the propagation time of the comparator.

According to one mode of implementation in which the comparator comprises two differential pairs with two respective types of conductivity, the generation of the compensation current is dedicated to each type of conductivity depending on the conductivity of the active differential pair.

Specifically, the method according to this aspect makes it possible to compensate any measurement of the difference, and, according to this mode of implementation, to do so dynamically in particular in a manner applied to the differential pair being used in the comparator.

According to one mode of implementation, the hysteresis control signal is the output signal of the comparator.

According to one mode of implementation, the hysteresis current is injected onto the positive output by way of one cascode transistor, and is extracted from the negative output by way of another cascode transistor.

The cascode transistors are advantageously controlled so as to increase the output impedance of the positive and negative outputs.

The intensity at which the hysteresis current is generated thus makes it possible to configure the amplitude of the hysteresis offset. Therefore, the amplitude of the hysteresis offset is not fixed for one and the same product, which may thus adapt to various requirements.

Moreover, passing through cascode transistors makes it possible in particular not to add stray capacitances at nodes of the comparator that support rapid signal variations, and thus not to increase the propagation time of the comparator.

According to another aspect, an integrated circuit including a comparator configured to generate an output signal representative of a comparison between input values, comprises a folded cascode stage having a positive output and a negative output. A regulation circuit is configured to regulate voltages on the positive output and on the negative output, including resistive elements situated respectively between each of the outputs and a common-mode node configured to have a constant common-mode voltage. A compensation circuit comprises at least one first current generator configured to generate a constant and continuous compensation current in the two resistive elements, so as to compensate a difference between effective threshold values of respectively at least one differential pair of transistors of the comparator, which pair is coupled upstream of the folded cascode stage. A hysteresis circuit comprises a second current generator configured to generate, in a manner controlled by a hysteresis control signal, a hysteresis current in the two resistive elements, so as to introduce a hysteresis offset to the input values that is necessary to generate the output signal of the comparator.

According to one embodiment, each first current generator comprises a pair of first current-generating circuits, which are configured respectively to inject the compensation current onto one of the positive or negative outputs by way of one respective cascode transistor and to extract the compensation current from the other of the outputs by way of another respective cascode transistor.

The cascode transistors are advantageously intended to be controlled so as to increase the output impedance of the positive and negative outputs.

According to one embodiment in which the comparator comprises two differential pairs with two respective types of conductivity, the compensation circuit is configured to generate a compensation current dedicated to each type of conductivity, controlled by a control signal representative of the conductivity of the active differential pair.

For example, the hysteresis control signal is the output signal of the comparator.

According to one embodiment, the hysteresis circuit comprises a pair of second current generators, which are configured respectively to inject the hysteresis current onto the positive output by way of one cascode transistor and to extract the hysteresis current from the negative output by way of another cascode transistor.

The cascode transistors are advantageously intended to be controlled so as to increase the output impedance of the positive and negative outputs.

BRIEF DESCRIPTION OF THE DRAWINGS

Other advantages and features of the invention will become apparent on examining the detailed description of wholly non-limiting embodiments and modes of implementation, and the appended drawings, in which.

DETAILED DESCRIPTION OF ILLUSTRATIVE EMBODIMENTS

Figure 1:
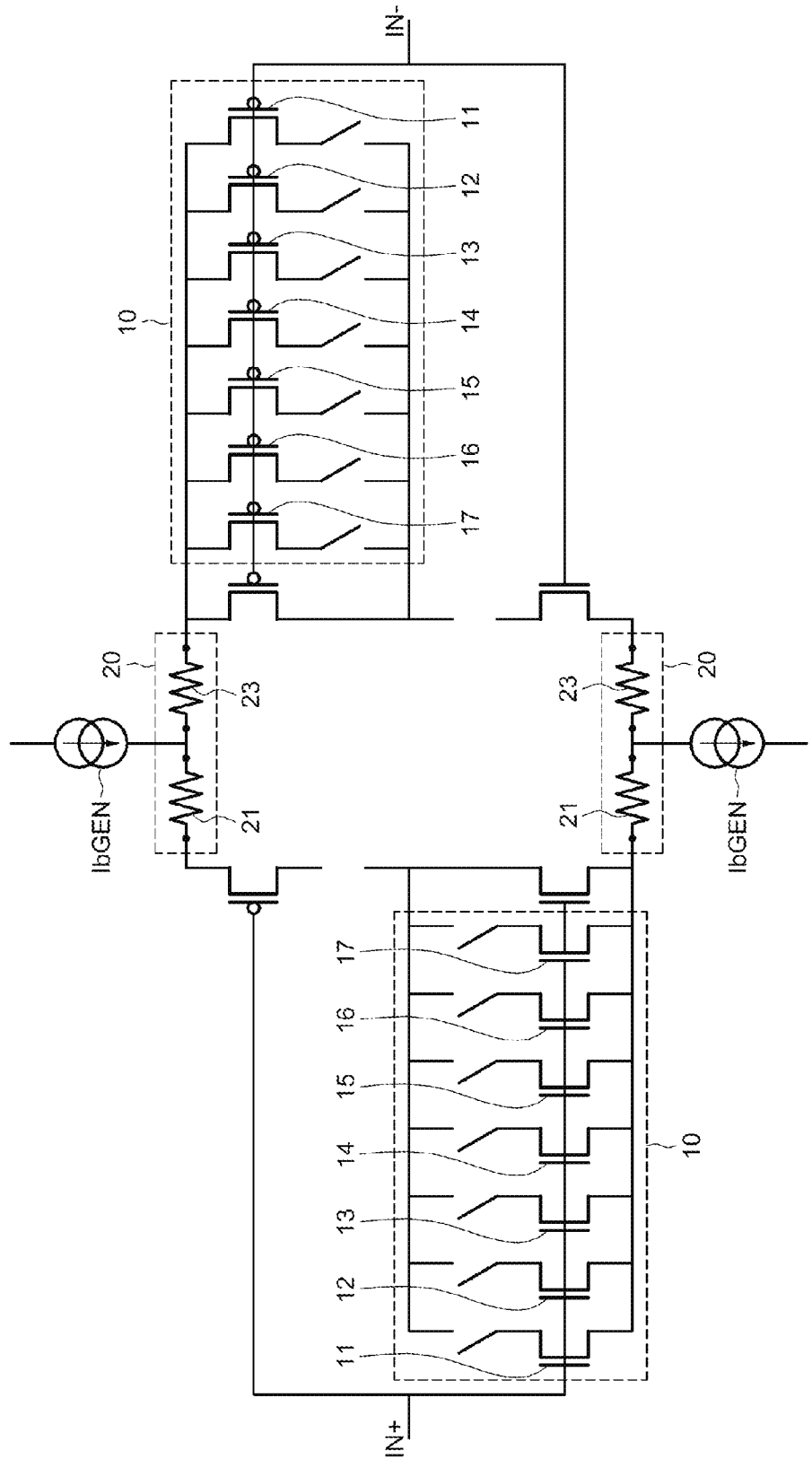
FIG. 1 shows a differential pair of transistors probably belonging to a conventional comparator.
Figure 2:
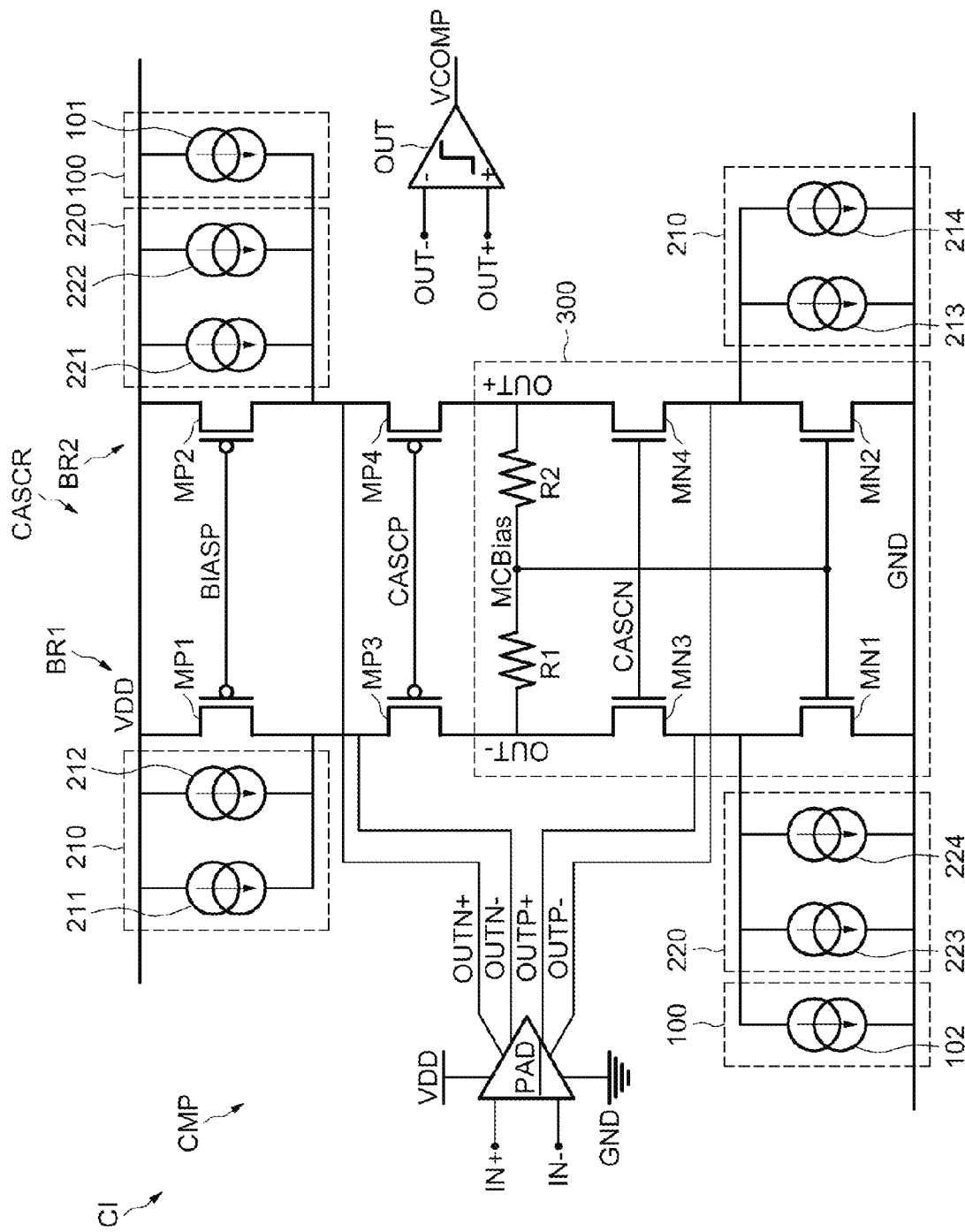
FIGS. 2 to 7 illustrate exemplary embodiments and modes of implementation of the invention.

FIG. 2 shows an exemplary integrated circuit CI including a comparator CMP, configured to generate a signal VCOMP at a first voltage level (logic '1') when the level of a positive input voltage IN+ exceeds the level of a negative input voltage IN−.

The comparator CMP includes a differential pre-amplification stage PAD, receiving the positive and negative input voltages on respective inputs IN+, IN− called positive input and negative input, respectively.

Figure 3:
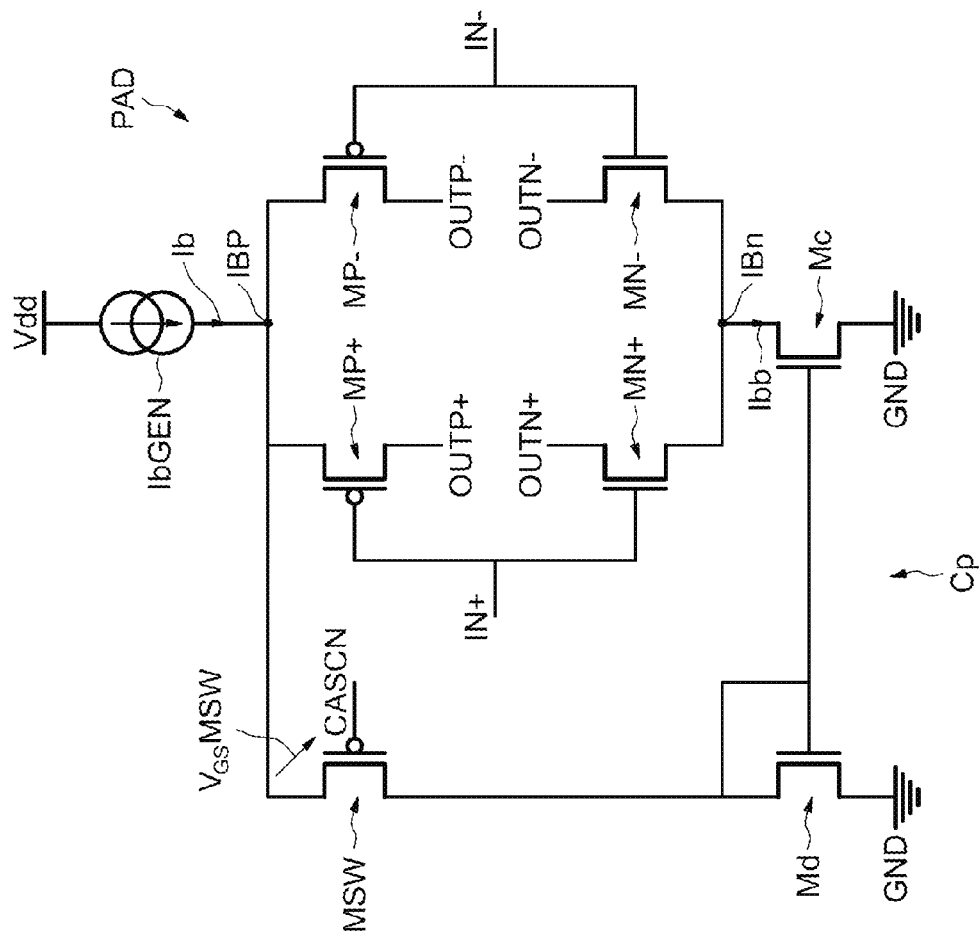

FIG. 3 shows an example of the differential pre-amplification stage PAD and a power supply device configured to supply a bias current Ib to the stage PAD.

The differential pre-amplification stage PAD includes two differential pairs of transistors. One differential pair, called p-type conduction differential pair, includes two PMOS transistors MP+, MP−, whose sources are coupled to a p-type conduction bias node IBP. The other differential pair, called n-type conduction differential pair, includes two NMOS transistors MN+, MN−, whose sources are coupled to an n-type conduction bias node IBN.

The gates of the transistors MP+, MN+ are coupled to the positive input IN+, whereas the gates of the transistors MP−, MN− are coupled to the negative input IN−. The drains of each transistor form a respective intermediate output, called p-type conduction and n-type conduction output, referenced OUTP+, OUTP−, OUTN+, OUTN−, respectively.

The pre-amplification stage PAD is supplied with a bias current Ib generated by a bias current generator IbGEN. The bias current Ib is applied either to the p-type conduction bias node, IBP, or to the n-type conduction bias node, IBN. The bias current Ibb flowing to the node IBN originates from a current mirror assembly Cp that is configured to copy the bias current Ib leaving the bias current generator IbGEN to the n-type conduction bias node IBN. The current mirror assembly Cp includes a diode-connected MOS transistor Md and a copy MOS transistor Mc controlled by the gate voltage of the diode-connected MOS transistor Md.

The current mirror assembly Cp is coupled to the bias current generator IbGEN by way of a MOS transistor MSW controlled by a signal CASCN that gives it a switch function. The transistor MSW and the signal CASCN are configured such that the voltage VGSMSW between the gate and source terminals of the transistor MSW automatically make the transistor MSW switch in the event of p-type or n-type conduction in the respective differential pairs MP+/MP−, MN+/MN−.

In the differential pre-amplification stage PAD, no additional element introduces stray capacitance at the nodes routing the differential signals of the comparator CMP.

Again with reference to FIG. 2, the differential pre-amplification stage PAD is coupled upstream of a folded cascode stage CASCR, as it is usually termed.

The folded cascode stage CASCR receives the signals on the four intermediate outputs OUTN+, OUTN−, OUTP+, OUTP− of the differential pairs MP+/MP−, MN+/MN− of the differential pre-amplification stage PAD.

The folded cascode stage CASCR comprises a first branch $BR_1$ and a second branch $BR_2$ that are symmetrical and configured to generate two differential output signals VOUT−, VOUT+ (FIG. 7) on respective differential output nodes OUT−, OUT+, from the four intermediate outputs of the differential pre-amplification stage PAD.

By convention in this example, the elements belonging to the first branch $BR_1$, on which the negative differential output signal OUT− is generated, are referred to using an odd reference, for example $MP_1$ or $MN_3$. The elements belonging to the second branch $BR_2$, on which the positive differential output signal OUT+ is generated, are referred to using an even reference, for example $MP_2$ or $MN_4$.

Each branch includes a current-generating PMOS transistor $MP_1$, $MP_2$, controlled by a signal BIASP so as to draw a current into each branch from a supply terminal VDD.

Cascode PMOS transistors $MP_3$, $MP_4$ are coupled between the current-generating transistors $MP_1$, MP2 and the respective output nodes OUT−, OUT+. The cascode transistors $MP_3$, $MP_4$ are controlled by a cascode signal CASCP so as to increase the output impedance and thus reduce the variations in the current with respect to the drain voltage. Thus, for any variation, in particular in the power supply VDD, the current-generating transistors $MP_1$, $MP_2$ have the same drain potential in order to generate a stable current.

Each branch includes a current mirror NMOS transistor $MN_1$, $MN_2$ coupled between a reference voltage terminal GND and the respective differential output nodes OUT−, OUT+, by way of cascode NMOS transistors $MN_3$, $MN_4$ that are controlled by a cascode signal CASCN, in a manner analogous to the cascode PMOS transistors $MP_3$, $MP_4$.

Each current mirror NMOS transistor $MN_1$, $MN_2$ is configured to copy a current flowing in the branch of the other current mirror transistor. Specifically, the gates of the mirror transistors $MN_1$, $MN_2$ are coupled to a common-mode node MCBias, which is coupled resistively to each output node OUT−, OUT+.

A respective resistive element $R_1$, $R_2$ is situated between each of the outputs OUT−, OUT+ and the common-mode node MCBias.

It is clarified here that the nature of the current mirror assembly $MN_1$, $MN_2$ imposes a constant voltage on the common-mode node MCBias, called MCBias common-mode voltage.

With reference to FIGS. 2 and 3, the positive n-type conduction intermediate output OUTN+, coming from the drain of the n-type conduction transistor MN+ controlled by the positive input IN+, is coupled to the output (drain) of the current-generating transistor MP2 of the second branch $BR_2$ of the folded cascode assembly CASCR.

The negative n-type conduction intermediate output OUTN−, coming from the drain of the n-type conduction transistor MN− controlled by the negative input IN−, is coupled to the output (drain) of the current-generating transistor $MP_1$ of the first branch $BR_1$ of the folded cascode assembly CASCR.

The positive p-type conduction intermediate output OUTP+, coming from the drain of the p-type conduction transistor MP+ controlled by the positive input IN+, is coupled to the output (drain) of the current mirror transistor $MN_1$ of the first branch $BR_1$ of the folded cascode assembly CASCR.

The negative p-type conduction intermediate output OUTP−, coming from the drain of the p-type conduction transistor MP− controlled by the negative input IN−, is coupled to the output (drain) of the current mirror transistor $MN_2$ of the second branch $BR_2$ of the folded cascode assembly CASCR.

Thus, in n-type conduction, a given distribution of the bias current Ibb is drawn from the drains of the current-generating transistors $MP_1$, $MP_2$. The given distribution of the current that is drawn results directly from the respective conductivities of the transistors MN+/MN− of the n-type conduction differential pair.

In p-type conduction, a given distribution of the bias current Ib is injected onto the drains of the current mirror transistors $MN_1$, $MN_2$. The given distribution of the current that is injected results directly from the respective conductivities of the transistors MP+/MP− of the p-type conduction differential pair.

The difference between resulting currents, at the differential outputs OUT−, OUT+, in the first branch $BR_1$ and in the second branch $BR_2$, is forced to be balanced out through the effect of the current mirror assemblies of the transistors $MN_1$, $MN_2$. Thus, a regulation current flows through the resistive elements $R_1$, $R_2$ to the common-mode node MCBias and between the two outputs OUT−, OUT+.

The resistive elements $R_1$, $R_2$ are biased by the flow of the regulation current, and voltages are generated at their terminals. The common-mode node MCBias is naturally at a constant potential of the current mirror assembly $MN_1$, $MN_2$. This potential is called MCBias common-mode voltage.

Thus, the voltages on the positive output OUT+ and on the negative output OUT− are increased or reduced, inversely to one another, when the regulation current flows through a resistive effect in the resistive elements $R_1$, $R_2$.

The regulation current is caused by the drawing from or injection into the branches $BR_1$, $BR_2$ of currents that are directly brought about by the differences in conductivities of the transistors of the differential pre-amplification stage PAD, which transistors are controlled by the positive input signal IN+ and negative input signal IN−.

Figure 7:
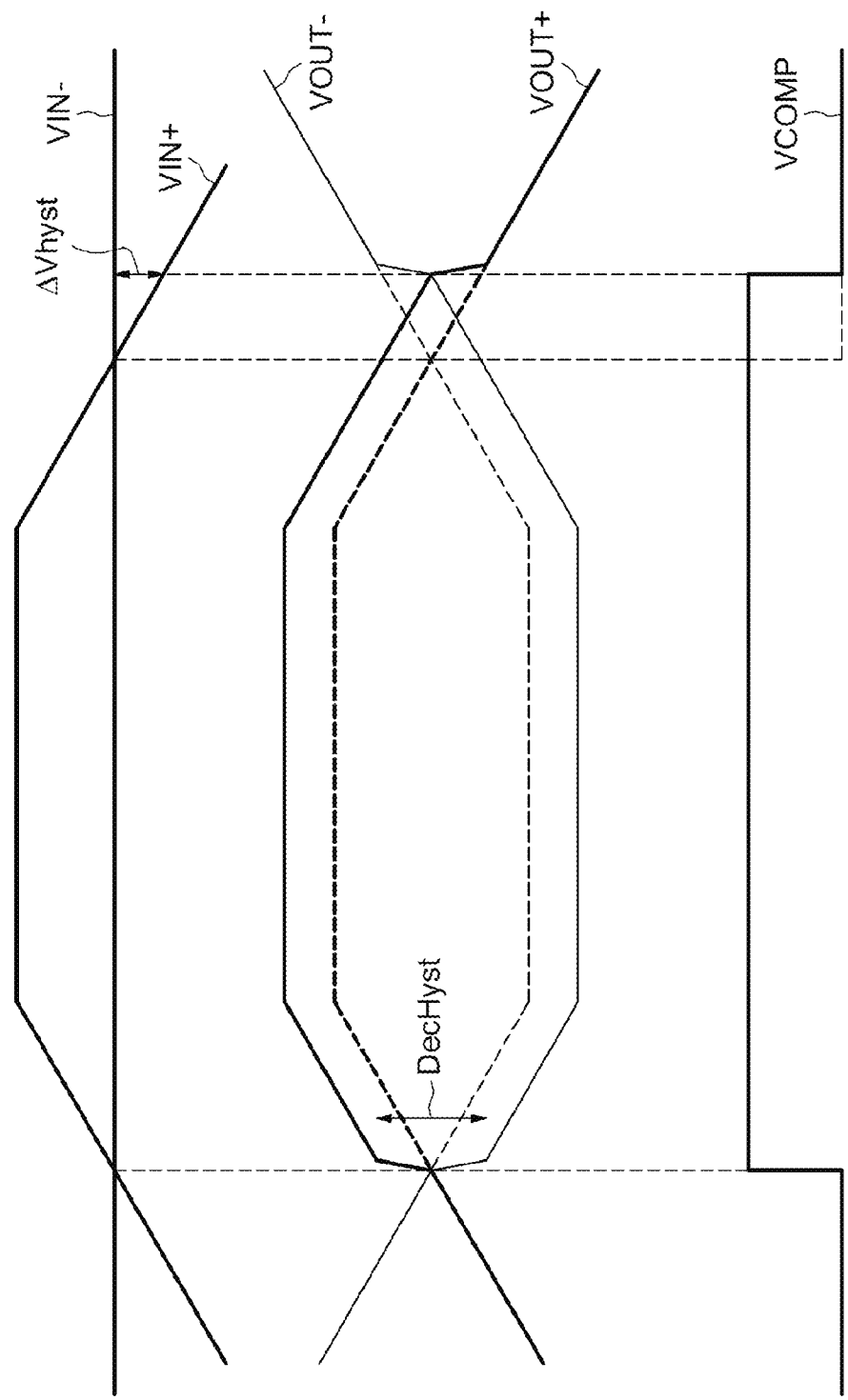

In other words, as illustrated by FIG. 7, the differential output voltages VOUT+, VOUT− (plotted in dashed lines here) approach and move away from an MCBias common-mode voltage, in proportion to the difference between the positive input voltage VIN+ and the negative input voltage VIN−. In this depiction, the MCBias common-mode voltage would be situated at the intersection of the output signals VOUT+, VOUT−.

Again with reference to FIG. 2, it has been seen that the resistive elements $R_1$, $R_2$, together with the current mirror transistors $MN_1$, $MN_2$, make it possible to generate the output voltages VOUT+, VOUT−, which are self-regulated to an MCBias common-mode voltage.

Thus, in this example, the resistive elements $R_1$, $R_2$ and the common-mode node MCBias, which is configured to have a constant common-mode voltage by virtue of the current mirror transistors $MN_1$, $MN_2$, together form a regulation circuit 300 configured to regulate voltages on the positive output OUT+ and on the negative output OUT−.

Moreover, an output stage OUT, such as an all-or-nothing comparator, receives the outputs OUT−, OUT+ of the folded cascode assembly CASCR, and makes it possible to generate an output signal VCOMP, for example a step signal when the positive output voltage OUT+ exceeds the negative output voltage OUT−, in particular as in the example illustrated by FIG. 7.

Furthermore, the integrated circuit CI comprises first and second compensation circuits 210, 220 and a hysteresis circuit 100, making it possible respectively to compensate input inaccuracies and to generate hysteresis without impairing the operating speed of the comparator CMP.

Specifically, as illustrated in FIG. 3, the inputs IN+, IN− are not subject to stray capacitive elements in the differential pre-amplifier PAD.

Figure 4:
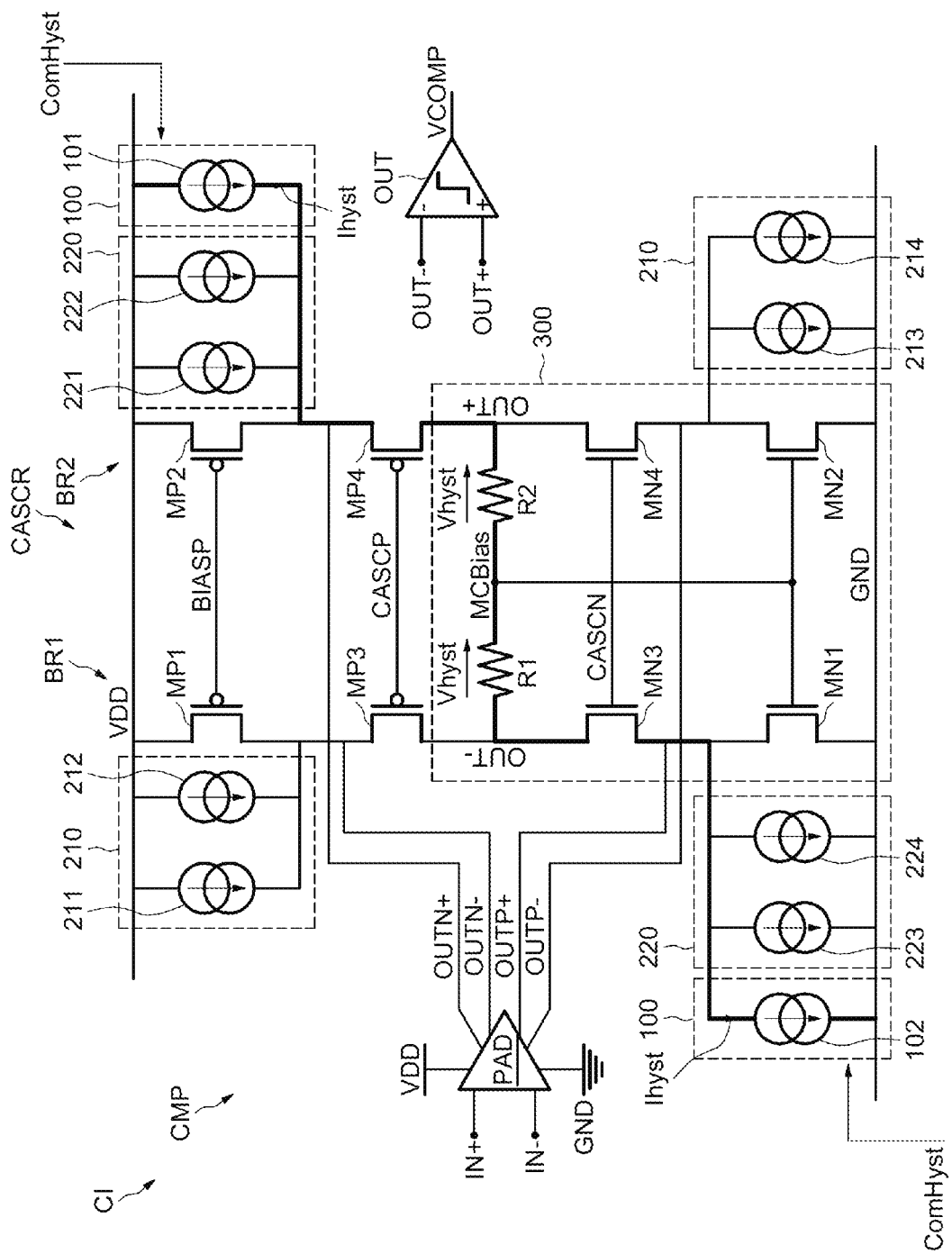

Reference is now made to FIG. 4.

The hysteresis circuit 100 is configured to offset the voltages on the positive output OUT+ and on the negative output OUT− by an offset Vhyst.

In this respect, the hysteresis circuit 100 comprises a current generator 101, configured to inject a hysteresis current Ihyst into the second branch $BR_2$ of the folded cascode assembly CASCR. The hysteresis circuit 100 also comprises a current generator 102 configured to extract a current equal to the hysteresis current Ihyst from the first branch $BR_1$ of the folded cascode assembly CASCR.

For example, the hysteresis current Ihyst is injected at the drain of the current-generating transistor $MP_2$, and is extracted at the drain of the current mirror transistor $MN_1$. In other words, the hysteresis current Ihyst is injected onto the positive output OUT+ by way of the cascode transistor $MP_4$, and extracted from the negative output OUT− by way of the cascode transistor $MN_3$.

The hysteresis current Ihyst is thus forced to pass through the two resistive elements $R_1$, $R_2$ that are situated respectively between each differential output OUT+, OUT− and the common-mode node MCBias.

The hysteresis current Ihyst flows in the two resistive elements $R_1$, $R_2$ in the same direction, in this example in the direction from the positive differential output OUT+ to the negative differential output OUT−.

The hysteresis current thus biases the resistive elements $R_1$, $R_2$, which generate a voltage Vhyst at their terminals. As the MCBias common-mode voltage is constant, an offset Vhyst in the voltages on the positive output OUT+ and on the negative output OUT− is thus introduced by the hysteresis circuit.

Thus, the hysteresis offset is introduced so as to reduce the voltage on the negative output OUT− and increase the voltage on the positive output OUT+.

The hysteresis current generators 101, 102 are able to be controlled by a hysteresis control signal ComHyst, such as, for example, by the output signal VCOMP.

FIG. 7 illustrates (in unbroken lines) the positive and negative output voltages VOUT+ and VOUT−, respectively, with the effect of the offset DecHyst introduced by the hysteresis circuit 100.

The hysteresis offset DecHyst on the output voltages VOUT+, VOUT− introduces an offset to the values of the input voltages VIN+, VIN− that is necessary to trigger generation of the output signal VCOMP.

Specifically, as illustrated by FIG. 7, the positive input voltage VIN+ has to be lower by least an offset ΔVhyst than the negative input voltage VIN− in order to equalize the differential output voltages VOUT+, VOUT−. Once the differential output voltages VOUT+, VOUT− have been equalized, the output voltage step VCOMP drops back to a low level, and controls the stoppage of the generation of the hysteresis offset DecHyst.

Figure 5:
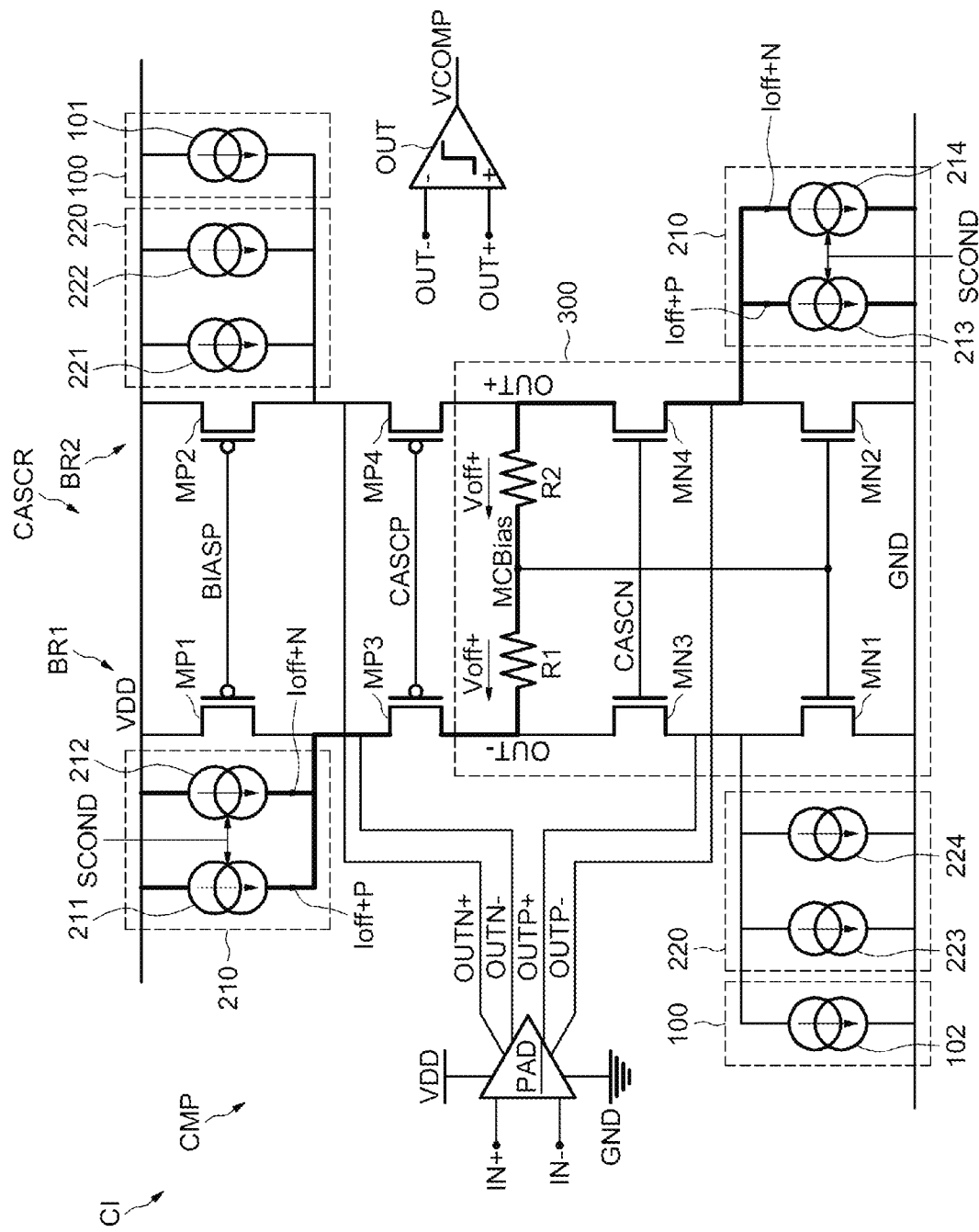

Reference is now made to FIG. 5.

The compensation circuits 210, 220 are configured to regulate a difference between the voltages on the positive output OUT+ and the negative output OUT−, comprising at least one current generator configured to generate a constant and continuous compensation current in the two resistive elements $R_1$, $R_2$.

The compensation circuits 210, 220 are, for example, intended to compensate a difference between effective threshold values of the differential pairs of transistors MN+/MN−, MP+/MP− of the differential pre-amplifier upstream of the folded cascode stage CASCR of the comparator CMP.

In other words, if the effective threshold values of the pairs of transistors are not identical, then the comparator may trigger an output signal VCOMP, whereas the signals at input are not equal. There is thus an offset, as it is usually termed, between the inputs IN+ and IN−.

In this case, compensating the effective threshold values of the pairs of transistors amounts to refining the offset between the positive input IN+ and the negative input IN−. This allows a more accurate comparison.

The compensation of the effective threshold values may be dedicated to each of the two differential pairs, that is to say for the p-type conduction pair and for the n-type conduction pair, independently.

Furthermore, the compensation of the effective threshold values, dedicated to each pair, may be performed by distancing the differential output voltages OUT+, OUT−, positively or negatively with respect to one another, depending on the effective values of a given embodiment.

Thus, the compensation circuits includes a positive offset compensation circuit 210, configured to increase the positive output voltage OUT+ with respect to the negative output voltage OUT−, and a negative offset compensation circuit 220, configured to reduce the positive output voltage OUT+ with respect to the negative output voltage OUT−.

The positive offset compensation circuit 210 includes two current generators 212, 214 that are intended to operate together to compensate the effective threshold voltages of the transistors of the n-type conduction differential pair, and two analogous current generators 211, 213 that are intended to operate together to compensate the effective threshold voltages of the transistors of the p-type conduction differential pair.

Analogously, the negative offset compensation circuit 220 includes two current generators 222, 224 that are intended to operate together to compensate the effective threshold voltages of the transistors of the n-type conduction differential pair, and two analogous current generators 221, 223 that are intended to operate together to compensate the effective threshold voltages of the transistors of the p-type conduction differential pair.

For example, the positive compensation circuit 210 comprises a current generator 211 configured to inject a positive offset compensation current Ioff+P into the first branch $BR_1$ of the folded cascode assembly CASCR. The positive compensation circuit 210 also comprises a current generator 213 configured to extract an equal positive offset compensation current Ioff+P from the second branch $BR_2$ of the folded cascode assembly CASCR.

For example, the compensation current Ioff+P is injected at the drain of the current-generating transistor $MP_1$, and is extracted at the drain of the current mirror transistor $MN_2$. In other words, the compensation current Ioff+P is injected onto the negative output OUT− by way of the cascode transistor $MP_3$, and extracted from the positive output OUT+ by way of the cascode transistor $MN_4$.

The current Ioff+P in this example makes it possible to compensate the threshold values of the transistors of the p-type conduction differential pair.

Two current generators 212, 214 that are connected in the same way as the above-mentioned current generators 211, 213 make it possible to compensate the threshold values of the transistors of the n-type conduction differential pair.

The compensation currents Ioff+P, Ioff+N are forced to pass through the two resistive elements $R_1$, $R_2$ that are situated respectively between each differential output OUT+, OUT− and the common-mode node MCBias.

The compensation currents Ioff+P, Ioff+N flow in the two resistive elements $R_1$, $R_2$ in the same direction, in this example in the direction from the negative differential output OUT− to the positive differential output OUT+.

The compensation currents Ioff+P, Ioff+N thus bias the resistive elements $R_1$, $R_2$, which generate a voltage Voff+ at their terminals. As the MCBias common-mode voltage is constant, a negative offset Voff− in the voltage on the positive output OUT+ and a positive offset Voff+ on the negative output OUT− are thus introduced by the compensation circuits.

Each pair of current generators 211/213 and 212/214 of the positive offset compensation circuit 210 is controlled by a signal SCOND depending on the type of conductivity of the active differential pair.

When the input voltages IN+, IN− are such that it is the p-type conductivity differential pair that is conductive, then the signal SCOND controls the generators 211/213, whereas when it is the n-type conductivity differential pair that is conductive, the signal SCOND controls the generators 212/214.

For example, the signal SCOND may be generated digitally, or by a comparator receiving the voltages at inputs IN+, IN−, or else originate from the switching transistor MSW described above with reference to FIG. 3.

Figure 6:
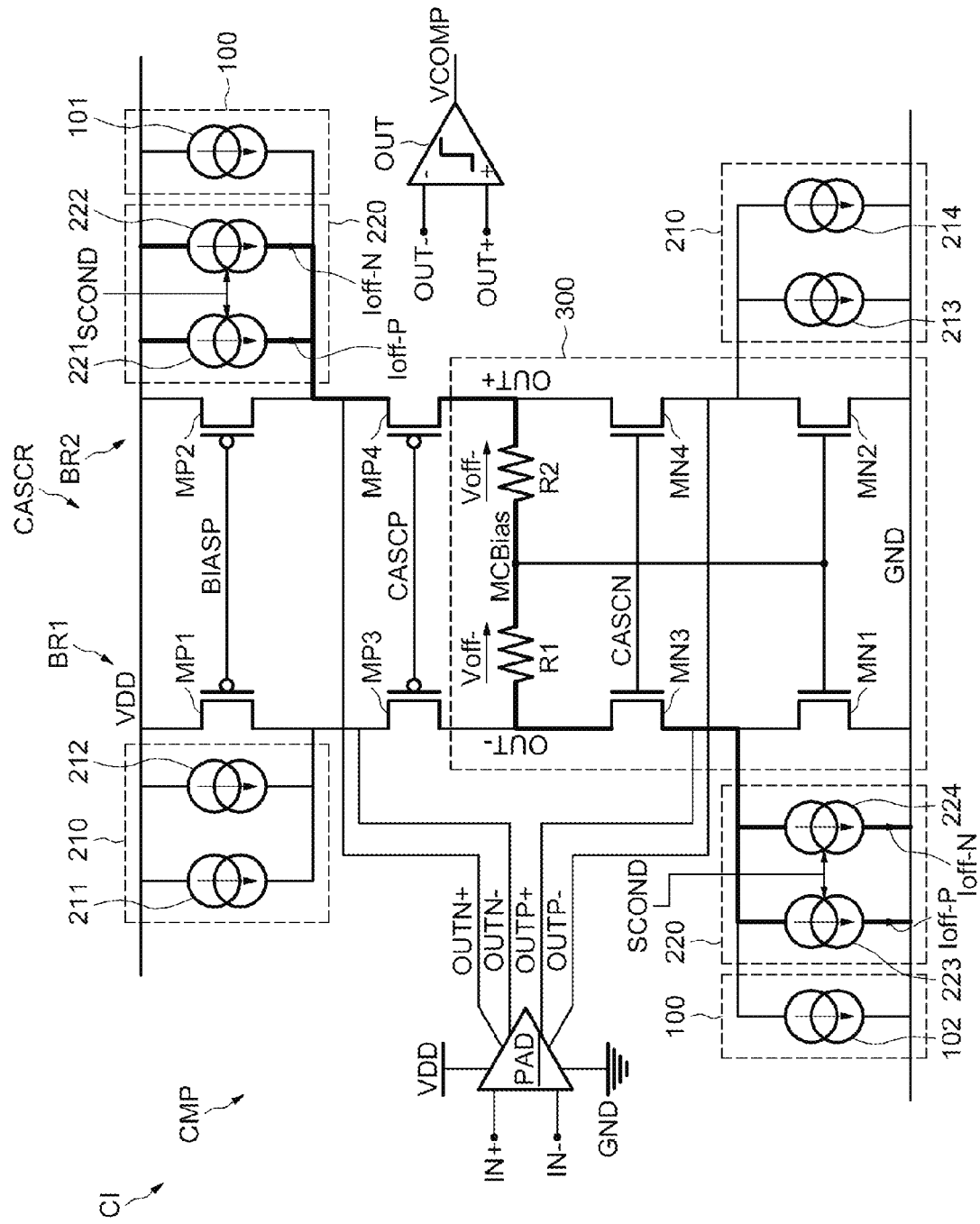

FIG. 6 shows the negative offset compensation circuit 220, including two current generators 221, 223 that are intended to operate together to compensate the effective threshold voltages of the transistors of the p-type conduction differential pair, and two analogous current generators 222, 224 that are intended to operate together to compensate the effective threshold voltages of the transistors of the n-type conduction differential pair.

The negative offset compensation circuit 220 has a function that is the reverse of that of the positive offset compensation circuit 210, introducing a positive offset Voff+ in the voltage on the positive output OUT+ and a negative offset Voff− on the negative output OUT−, and is situated at the same location of the folded cascode assembly CASCR as the hysteresis circuit.

It is added that all of the current generators 211, 212, 213, 214, 221, 222, 223, 224 belonging to the compensation circuits 210, 220 are configured to generate a current whose intensity is dedicated to each hardware manufacturing implementation of the differential pairs and the effective value of their threshold voltages. For example, measurements and adjustments of the current generators are performed in this respect during a calibration phase in the manufacture of the integrated circuit CI.

Furthermore, the hysteresis current generators 101, 102 may also be able to be configured so as to be able to apply various hysteresis offset values to one and the same integrated circuit CI.

Due to constraints in the production of the compensation and hysteresis circuits, the intensities of the compensation and hysteresis currents may be adjusted according to tiered values whose pitch is set in the manufacturing of the integrated circuit.

Furthermore, it is advantageous for the current generators 101, 102, 211, 212, 213, 214, 221, 222, 223, 224 belonging to the hysteresis circuit 100 and to the compensation circuits 210, 220 to be coupled to the positive output OUT+ and the negative output OUT− by way of the respective cascode transistors $MP_3$, $MP_4$, $MN_3$, $MN_4$, so as in particular not to add capacitive elements, originating from the current-generating circuits, directly to the outputs OUT+, OUT−.

Specifically, the rapid variations in the output voltages VOUT+, VOUT− result from the regulation current flowing in two resistive elements $R_1$, $R_2$, but this regulation current does not flow beyond the conduction terminals of the cascode transistors $MP_3$, $MP_4$, $MN_3$, $MN_4$. Effectively, the drains of the current-generating transistors $MP_1$, $MP_2$ and of the current mirror transistors $MN_1$, $MN_2$ support virtually no variations due to the play in the flow of the currents in the symmetrical branches $BR_1$, $BR_2$ of the folded cascode stage CASCR.

As a result, this makes it possible functionally not to add stray capacitances at nodes of the comparator that support rapid signal variations, and thus not to increase the propagation time of the comparator.

What is claimed is:

1. A method for biasing a positive output and a negative output of a folded cascode stage of a comparator, the method comprising:

regulating voltages on the positive output and on the negative output by flowing a regulation current in first and second resistive elements, wherein the first and second resistive elements are coupled between the positive and negative outputs and wherein a common-mode node having a constant common-mode voltage is coupled between the first and second resistive elements;

generating a constant and continuous compensation current in the first and second resistive elements to compensate for a difference between effective threshold values of a differential pair of transistors of the comparator, the differential pair of transistors coupled upstream of the folded cascode stage; and generating, in a manner controlled by a hysteresis control signal, a hysteresis current in the first and second resistive elements to introduce a hysteresis offset to input values of the comparator to trigger an output signal representative of a comparison of the input values.

2. The method of claim 1, wherein the compensation current is injected onto one of the positive or negative outputs by way of one respective cascode transistor and is extracted from the other of the positive or negative outputs by way of another respective cascode transistor.

3. The method of claim 1, wherein the comparator comprises two differential pairs with two respective types of conductivity, and wherein generating the compensation current is dedicated to each type of conductivity depending on the conductivity of an active differential pair of the two differential pairs.

4. The method of claim 1, wherein the hysteresis control signal is the output signal.

5. The method of claim 1, wherein the hysteresis current is injected onto the positive output by way of one cascode transistor and extracted from the negative output by way of another cascode transistor.

6. An integrated circuit comprising a comparator configured to generate an output signal representative of a comparison between input values, the comparator comprising a folded cascode stage having a positive output and a negative output, the folded cascode stage comprising:

a regulation circuit configured to regulate voltages on the positive output and on the negative output, the regulation circuit comprising resistive elements coupled between the positive output and the negative output, wherein a common-mode node configured to have a constant common-mode voltage is coupled between the resistive elements;
a compensation circuit comprising a first current generator configured to generate a compensation current in the resistive elements to compensate a difference between effective threshold values of a pair of transistors of the comparator, wherein the pair of transistors is coupled upstream of the folded cascode stage; and
a hysteresis circuit comprising a second current generator configured to generate, in a manner controlled by a hysteresis control signal, a hysteresis current in the resistive elements to introduce a hysteresis offset to the input values to generate the output signal of the comparator.

7. The integrated circuit of claim 6, wherein the first current generator comprises a pair of first current-generating circuits configured respectively to inject the compensation current onto one of the positive output or the negative output by way of one respective cascode transistor and to extract the compensation current from the other of the positive output or the negative output by way of another respective cascode transistor.

8. The integrated circuit of claim 6, wherein the comparator further comprises two differential pairs with two respective types of conductivity, wherein the compensation circuit is controlled by a control signal representative of the conductivity of an active differential pair of the two differential pairs, and wherein the compensation circuit is configured to generate a compensation current dedicated to each type of conductivity.

9. The integrated circuit of claim 6, wherein the hysteresis control signal is the output signal of the comparator.

10. The integrated circuit of claim 6, wherein the hysteresis circuit further comprises a pair of second current generators that are configured respectively to inject the hysteresis current onto the positive output by way of one cascode transistor and to extract the hysteresis current from the negative output by way of another cascode transistor.

11. A circuit comprising:
first and second inputs configured to receive respectively first and second input signals;
a comparator output configured to produce an output signal based on a difference between the first and second input signals and a hysteresis offset;
a folded cascode stage coupled between the first and second inputs and the comparator output, the folded cascode stage comprising:
first and second outputs configured to produce respectively first and second output signals;
a first differential pair of a first type coupled between the first and second outputs and a first supply terminal;
a second differential pair of a second type coupled between the first and second outputs and a second supply terminal;
first and second resistors coupled between the first and second outputs;
a first current generator configured to generate a compensation current flowing through the first and second resistors; and
a second current generator configured to generate a hysteresis current flowing through first and second resistors to introduce the hysteresis offset.

12. The circuit of claim 11, wherein:
the first current generator comprises:
a first current-generating circuit coupled between the first differential pair and the first supply terminal, the first current-generating circuit configured to inject the compensation current via the first differential pair, and
a second current-generating circuit coupled between the second differential pair and the second supply terminal, the second current-generating circuit configured to extract the compensation current via the second differential pair; and
the second current generator comprises:
a third current-generating circuit coupled between the first differential pair and the first supply terminal, the third current-generating circuit configured to inject the hysteresis current via the first differential pair, and
a fourth current-generating circuit coupled between the second differential pair and the second supply terminal, the fourth current-generating circuit configured to extract the hysteresis current via the second differential pair.

13. The circuit of claim 12, wherein the first current-generating circuit and the second current-generating circuit are controlled by a first control signal.

14. The circuit of claim 13, further comprising a second comparator having first and second inputs configured to receive respectively the first and second input signals and configured to generate the first control signal.

15. The circuit of claim 11, further comprises a differential pre-amplification stage coupled between the first and second inputs and the folded cascode stage.

16. The circuit of claim 15, wherein:
first and second transistors of the first differential pair are coupled respectively between first and second nodes and the first and second resistors;
third and fourth transistors of the second differential pair are coupled respectively between third and fourth nodes and the first and second resistors; and
the differential pre-amplification stage comprises:
a fifth transistor of the first type coupled between the first supply terminal and the third node and having a control terminal coupled to the first input,
a sixth transistor of the first type coupled between the first supply terminal and the fourth node and having a control terminal coupled to the second input,
a seventh transistor of the second type coupled between the second supply terminal and the second node and having a control terminal coupled to the first input, and
an eighth transistor of the second type coupled between the second supply terminal and the first node and having a control terminal coupled to the second input.

17. The circuit of claim 16, wherein the folded cascode stage further comprises:
a ninth transistor of the second type coupled between the third transistor and the second supply terminal; and
a tenth transistor of the second type coupled between the fourth transistor and the second supply terminal, wherein a common-mode node coupled between the first and second resistors is coupled to a control terminal of the ninth and tenth transistors.

18. The circuit of claim 11, wherein the second current generator is controlled by the output signal.

19. The circuit of claim 11, wherein the first type is a p-type and the second type is an n-type.

20. The circuit of claim 11, wherein the second supply terminal is couple to ground and wherein the first supply terminal is configured to receive a voltage higher than ground.

* * * * *